United States Patent [19]
Kitamura et al.

[11] Patent Number: 6,037,627
[45] Date of Patent: Mar. 14, 2000

[54] MOS SEMICONDUCTOR DEVICE

[75] Inventors: Kenji Kitamura; Jun Osanai; Sumio Koiwa, all of Chiba, Japan

[73] Assignee: Seiko Instruments Inc., Japan

[21] Appl. No.: 08/906,179

[22] Filed: Aug. 4, 1997

[30] Foreign Application Priority Data

| Aug. 2, 1996 | [JP] | Japan | 8-205034 |
| Nov. 1, 1996 | [JP] | Japan | 8-292024 |
| Jul. 28, 1997 | [JP] | Japan | 9-201991 |

[51] Int. Cl.[7] .................................................. H01L 29/72
[52] U.S. Cl. .......................... 257/324; 257/406; 257/411
[58] Field of Search .................................... 257/406, 300, 257/411, 324, 408, 326, 336, 344

[56] References Cited

U.S. PATENT DOCUMENTS

| 4,057,819 | 11/1977 | Owen et al. | 257/324 |
| 4,869,781 | 9/1989 | Euen et al. | 257/411 |
| 5,495,117 | 2/1996 | Larson | 257/300 |
| 5,734,185 | 3/1998 | Iguchi et al. | 257/406 |
| 5,847,427 | 12/1998 | Hagiwara | 257/411 |

FOREIGN PATENT DOCUMENTS

| 6-151833 | 5/1994 | Japan | 257/411 |
| 6-232416 | 8/1994 | Japan | 257/411 |

Primary Examiner—Donald L. Monin, Jr.
Attorney, Agent, or Firm—Adams & Wilks

[57] ABSTRACT

A MOS semiconductor device comprises a semiconductor substrate having source and drain regions, a first insulating film disposed over the substrate in a space overlapping opposed edges of the source and drain regions, and a gate electrode disposed on the first insulating film. A second insulating film is disposed at overlapping portions between the gate electrode and the source and drain regions to prevent the formation of a space therebetween.

17 Claims, 12 Drawing Sheets

MOS SEMICONDUCTOR DEVICE

BACKGROUND OF THE INVENTION

The present invention relates to a semiconductor device, and particularly to an MOS semiconductor device with high withstand voltage, and a method of manufacturing the same.

Figure 3A:
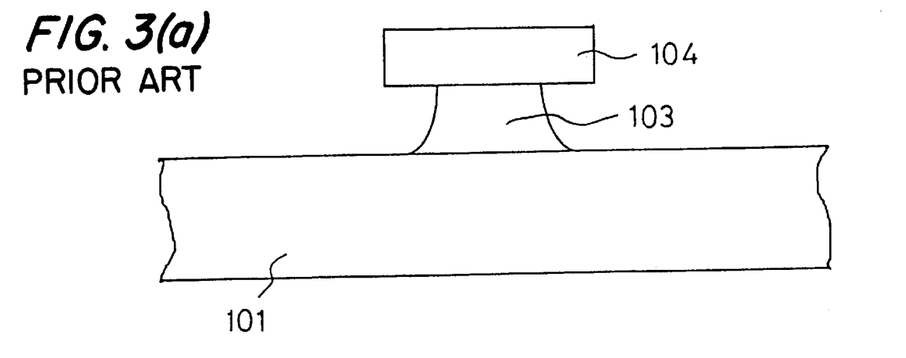
FIGS. 3a–3c are sectional views according to a step sequence showing a conventional manufacturing method of a semiconductor device.
Figure 3B:
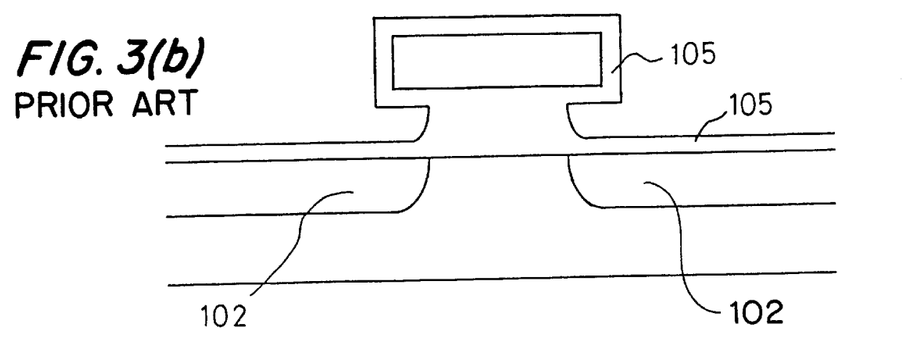
Figure 3C:
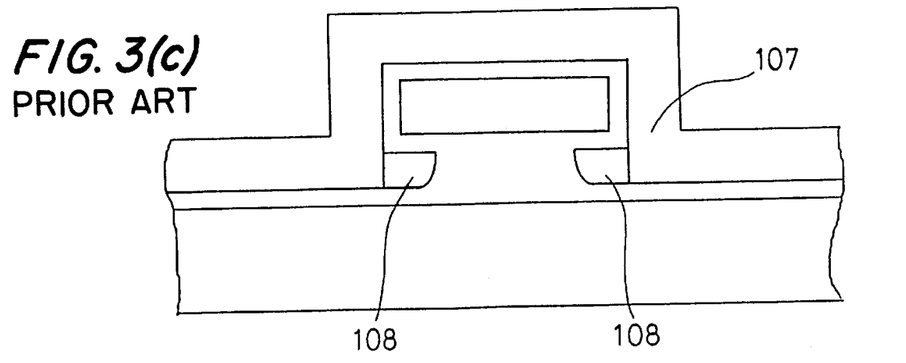

FIG. 3 is a sectional view showing a conventional manufacturing step sequence of an MOS semiconductor device. FIG. 3(a) shows a state in which after a gate electrode 104 is formed on a gate insulating film 103 on a semiconductor substrate 101, the gate insulating film 103 on such portions as to be formed into a source diffusion and a drain diffusion 102, 102, and under the end of the gate electrode 104 is wet etched. In order to assure the reliability of a semiconductor device, it is normally necessary to set the thickness of the gate insulating film 103 made of a silicon thermal oxidation film to about 3 MV/cm. For example, in a high withstand voltage MOS semiconductor device, when 30 V is applied between the gate electrode 104 and the semiconductor substrate 101, the oxide film thickness of 1000 Å is required. In that case, when impurities are implanted by using a high current ion implantation apparatus at the subsequent formation of a source and drain, it is difficult to sufficiently implant the impurities into the semiconductor substrate due to the restriction of an implantation energy. Thus, it is necessary to etch the gate insulating film on such portions as to be formed subsequently into the source diffusion and drain diffusion by wet etching after the gate electrode is formed. However, since the wet etching is isotropic, the gate insulating film 103 under the end of the gate electrode 104 is also etched.

Next, as shown in FIG. 3(b), an oxide film 105 is formed on the semiconductor substrate 101 and the surface of the gate electrode 104 by a thermal oxidation method, and impurity implantation is carried out by using the high current ion implantation apparatus to form the source diffusion 102 and the drain diffusion 102. When the thickness of the oxide film is made about 200 Å at this time, the impurity implantation is sufficiently carried out. Thereafter, as shown in FIG. 3(c), an intermediate insulating film 107 is formed by a CVD method.

In the MOS semiconductor device manufactured by the above conventional manufacturing method, spaces 108 are formed at overlap portions between the gate electrode 104 and the source diffusion 102/drain diffusion 102, and the spaces 108 cause the reliability of the MOS semiconductor device to be extremely lowered.

SUMMARY OF THE INVENTION

In order to solve the above problem, the present invention employs the following means.

(1) An MOS semiconductor device is characterized in that insulating films at overlap portions between a gate electrode and a source diffusion/drain diffusion formed in a semiconductor substrate are composed of plural types of insulating films.

(2) An MOS semiconductor device is characterized in that an insulating film between a gate electrode and a semiconductor substrate is a silicon oxide film having a thickness of not less than 500 Å.

(3) An MOS semiconductor device is characterized in that at least one of the insulating films at overlap portions between a gate electrode and a source diffusion/drain diffusion is a silicon oxide film and at least one of the insulating films is a silicon nitride film.

(4) An MOS semiconductor device is characterized in that at least one of the insulating films at overlap portions between a gate electrode and a source diffusion/drain diffusion is a silicon thermal oxidation film and at least one of the insulating films is a silicon oxide film by a CVD method.

(5) A method of manufacturing an MOS semiconductor device is characterized by comprising the steps of forming a gate insulating film on a semiconductor substrate, forming a gate electrode on the gate insulating film, wet etching the gate insulating film, forming an oxide film on the semiconductor substrate and the surface of the gate electrode by a thermal oxidation method, applying an insulating film by a CVD method, etching the insulating film by a dry etching method, and introducing impurities into the semiconductor substrate.

(6) A method of manufacturing an MOS semiconductor device is characterized in that an insulating film applied by a CVD method is an oxide film or a nitride film with a thickness of 300 Å to 1,000 Å.

DETAILED DESCRIPTION

Embodiment mode of the present invention will be described hereinafter with reference to the drawings.

Figure 1:
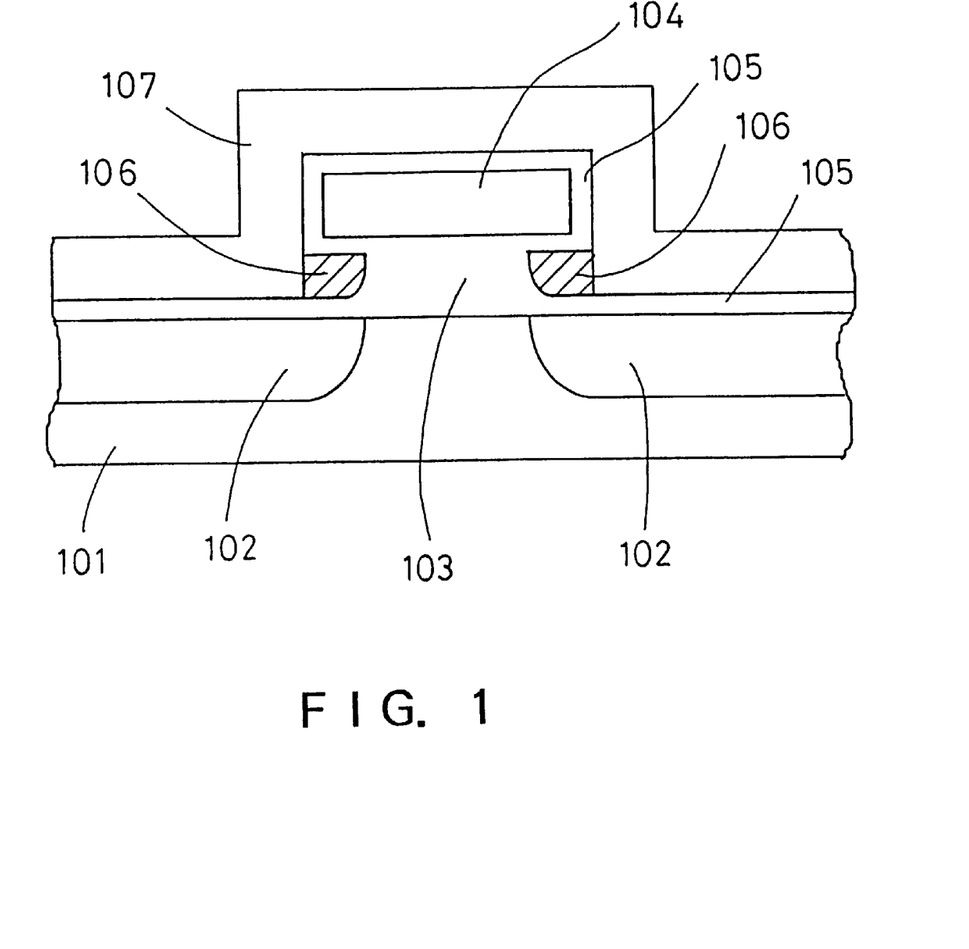
FIG. 1 is a schematic sectional view showing a first embodiment of a semiconductor device of the present invention.

FIG. 1 is a schematic sectional view showing an embodiment of a semiconductor device according to a manufacturing method of the present invention. A source diffusion and a drain diffusion 102 with a conductivity type opposite to a substrate 101 is formed in the semiconductor substrate 101, so that an MOS transistor comprising a gate electrode 104 and a gate insulating film 103 is formed. The gate electrode 104 is generally plate-shaped and has a generally uniform cross-section.

In FIG. 1, a thermal oxidation film 105 is formed on the gate electrode 104, the source diffusion and the drain diffusion 102 of the MOS transistor, and insulating films 106 are embedded in overlap portions between the gate electrode 104 and the source diffusion/drain diffusion 102.

By taking such a structure, as compared with a conventional structure having a space, TDDB (Time Dependent Dielectric Breakdown) characteristics occurring between the gate electrode 104 and the source diffusion or drain diffusion 102 are remarkably improved. Further, remarkable improvement is seen in withstanding characteristics of CDM (Charge Device Method) as one method of ESD (Electro Static Discharge) evaluation. Although the conventional structure broke down at 750 V, the present structure did not break down even at 3,000 V.

Figure 2A:
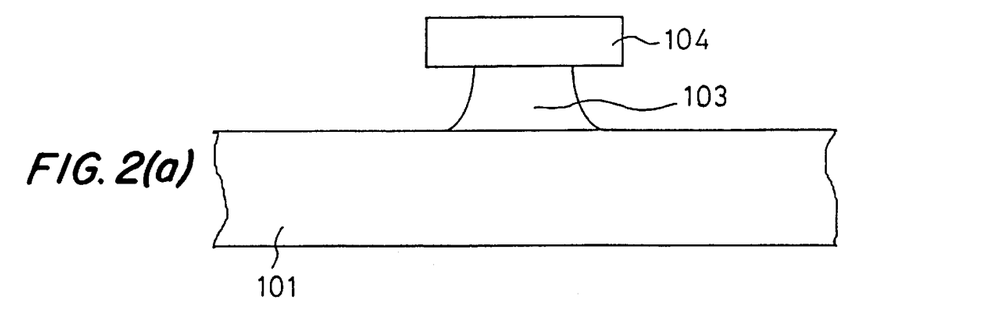
FIGS. 2a–2c are is a sectional views according to a step sequence showing a manufacturing method of the first embodiment of the semiconductor device of the present invention.

FIG. 2 is a sectional view according to a step sequence showing a manufacturing method of the present invention. FIG. 2(a) shows a state in which, after the gate electrode 104 was formed on the gate insulating film 103 on the semiconductor substrate 101, the gate insulating film 103 on such portions as to be subsequently formed into the source diffusion/drain diffusion 102 and under the end of the gate electrode 104, is removed by wet etching.

For example, in an MOS semiconductor device having a power source voltage of 30 V, in order to assure the reliability of the semiconductor device, it is normally necessary to set the thickness of the gate insulating film 103 made of a silicon thermal oxidation film to about 3 MV/cm, so that the oxide film thickness of not less than 1,000 Å is required. In this case, wet etching using hydrofluoric acid equivalent to etching of 1,200 Å is carried out so that the gate insulating film 103 does not remain on the semiconductor substrate 101. Since the wet etching is isotropic, an undercut of about 0.1 μm occurs under the gate electrode 104.

Figure 2B:
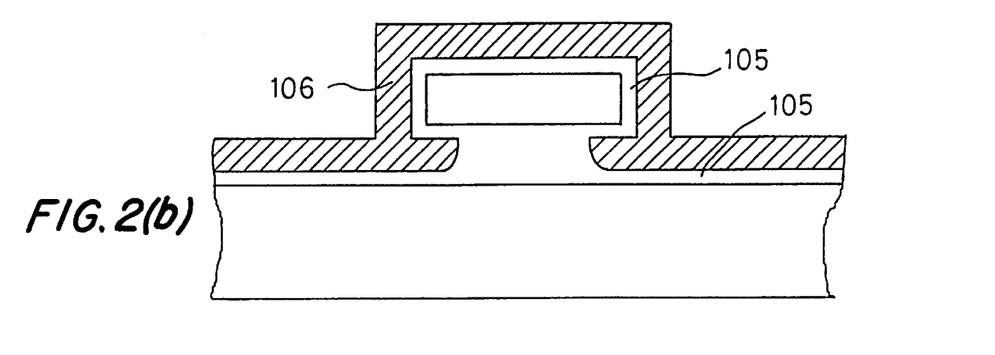

Next, as shown in FIG. 2(b), the thermal oxidation film 105 of about 200 Å is formed on the semiconductor substrate 101 and the surface of the gate electrode by a thermal oxidation method, and further the insulating film 106 of an oxide film or a nitride film with a thickness of 300 Å to 1,000 Å is applied by a CVD method. Here, the distance between the gate electrode 104 and the semiconductor substrate 101 is 1,000 Å, so that even if the thermal oxide film 105 of about 200 Å is grown, a space under the end of the gate electrode 104 can not be eliminated. At this time, although it is also conceivable to eliminate the space by increasing the thickness of the oxide film 105, in view of the maximum implantation energy 150 KeV of a high current ion implantation apparatus at present, the thickness is at most about 400 Å, so that it is impossible to completely eliminate the space.

Next, when the insulating film 106 of the nitride film is applied by the CVD method, it is necessary to completely fill the space, and for that purpose, it is more effective to use a low pressure CVD method with a good coverage. Further, as for the kind of the insulating film 106, a nitride film, which can have some selection ratio with respect to the under thermal oxidation film at subsequent dry etching as compared with an oxide film, is advantageous for purposes of stability and reduction of steps. If an oxide film is used, etching is stopped when the semiconductor substrate is exposed, so that a thermal oxidation step is additionally required.

Figure 2C:
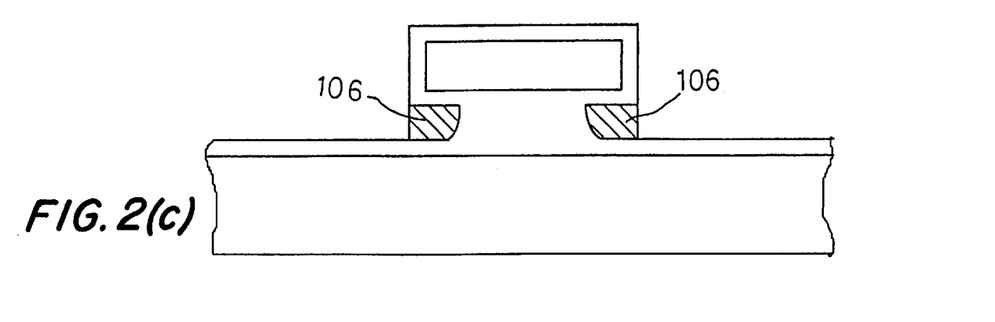

Thereafter, as shown in FIG. 2(c), when etching is carried out by the dry etching method, since the etching has directionality, it is possible to selectively leave only the insulating film 106 of the nitride film at the portion sandwiched between the end of the gate electrode 104 and the semiconductor substrate 101. Thereafter, the source diffusion and drain diffusion 102 are formed by an ion implantation method, and the intermediate insulating film 107 is formed by the CVD method.

Figure 4:
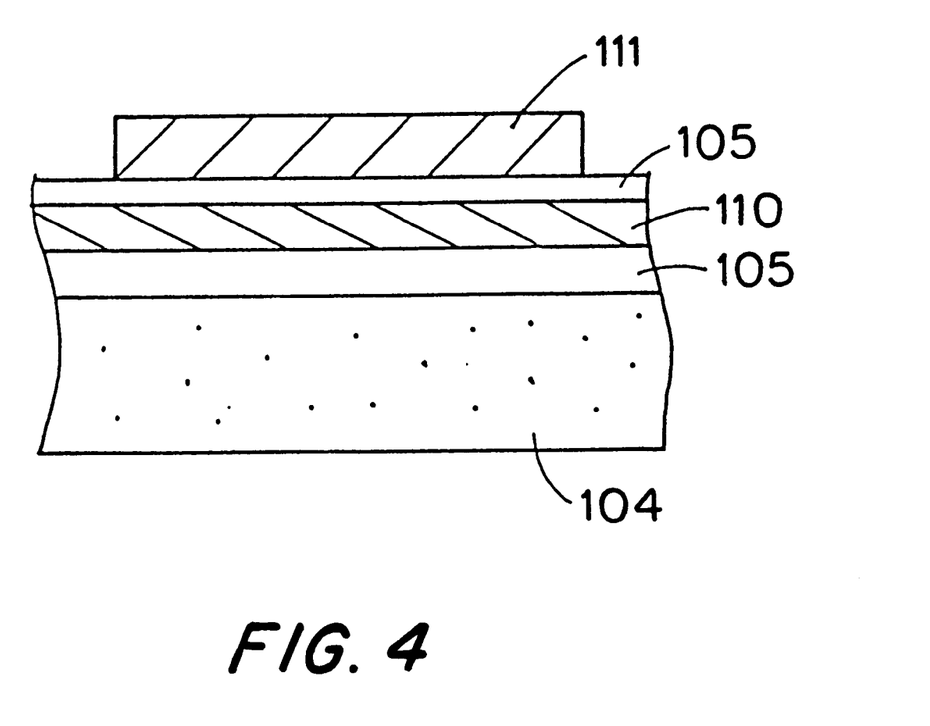
FIG. 4 is a schematic sectional view showing a second embodiment of a semiconductor device of the present invention.

FIG. 4 shows a second embodiment of a semiconductor device of the present invention. On a gate electrode 104 of an MOS transistor, there is formed an insulating layer in which thermal oxidation films 105 are formed on the upper and lower sides of the silicon nitride film 110, and thereon, a polysilicon 111 is formed so that a capacitance element is formed. The thickness of the thermal oxidation film 105 under the silicon nitride film 110 is about 300 Å to 700 Å, the thickness of the silicon nitride film 110 is about 200 Å to 1,000 Å, the thickness of the thermal oxidation film 105 on the silicon nitride film 110 is about 10 Å to 100 Å. By taking such a structure, it is possible to make a semiconductor device having high reliability so that the device does not break down even if a high voltage is applied between the gate electrode 104 and the polysilicon 111.

Figure 5:
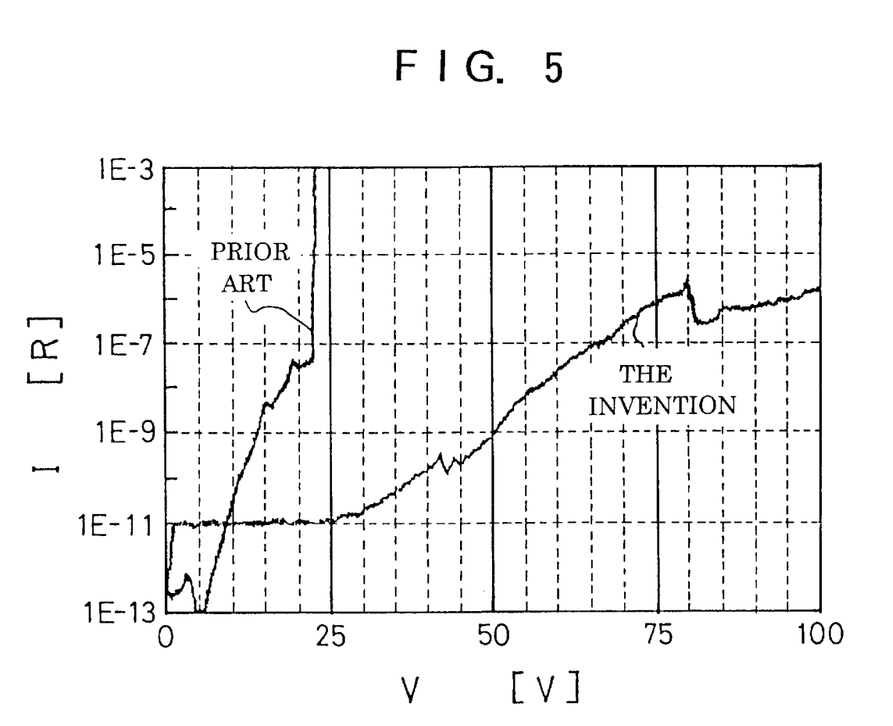
FIG. 5 is a graph showing relationship between voltages and leak currents of capacitors.

FIG. 5 shows values of current between electrodes when voltage is applied to an electrode between the gate electrode 104 and the polysilicon 111. The axis of abscissas of the graph indicates the voltage, and the axis of ordinates thereof indicates the current. It is understood that in a conventional device, a leak current abruptly increases from the vicinity of 10 V, and the device breaks down at 22 V, while a device according to the present invention has little leak current up to the vicinity of 30 V and its break down voltage is high. The polysilicon 111 has an area smaller than the gate electrode 104. Since an electric field is concentrated at a place where the polysilicon 111 crosses over the gate electrode 104, the break down voltage is lowered. Further, since the relative dielectric constant of $Si_3N_4$ is 7.5 and is larger than the relative dielectric constant 3.9 of the silicon oxide film, the capacitance can be increased by using the $Si_3N_4$. That is, the area can be decreased.

FIG. 6 shows a second embodiment of a manufacturing method of the present invention. In step A shown in FIG. 6(A), after a silicon nitride film ($Si_3N_4$) is patterned at a region where an MOS transistor is formed on a semiconductor substrate 101, thermal oxidation is carried out to form a field oxide film 109. Next, the silicon nitride film is removed and a gate oxide film 103 is formed. The thickness of the gate oxide film 103 was made about 900 Å.

Figure 6A:
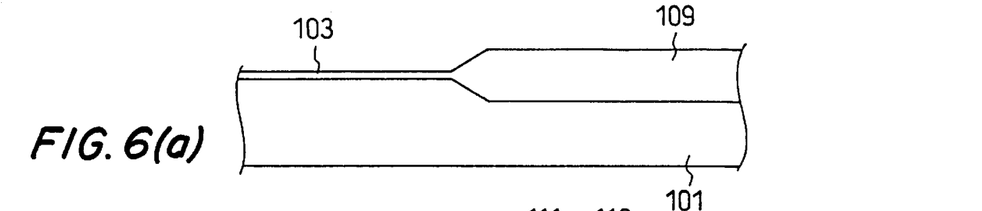
FIGS. 6a–6d are sectional views according to a step sequence showing a manufacturing method of a second embodiment of a semiconductor device of the present invention.
Figure 6B:
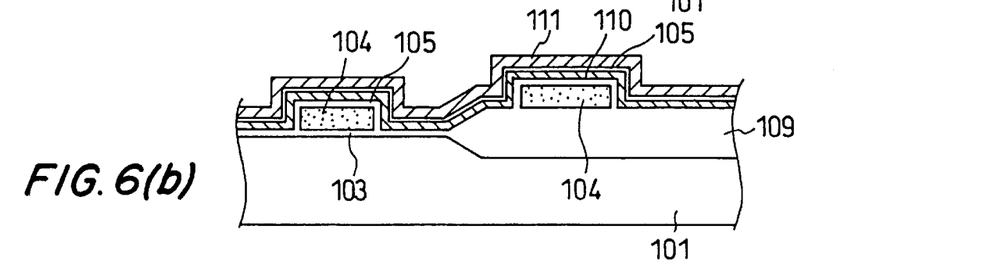
Figure 7:
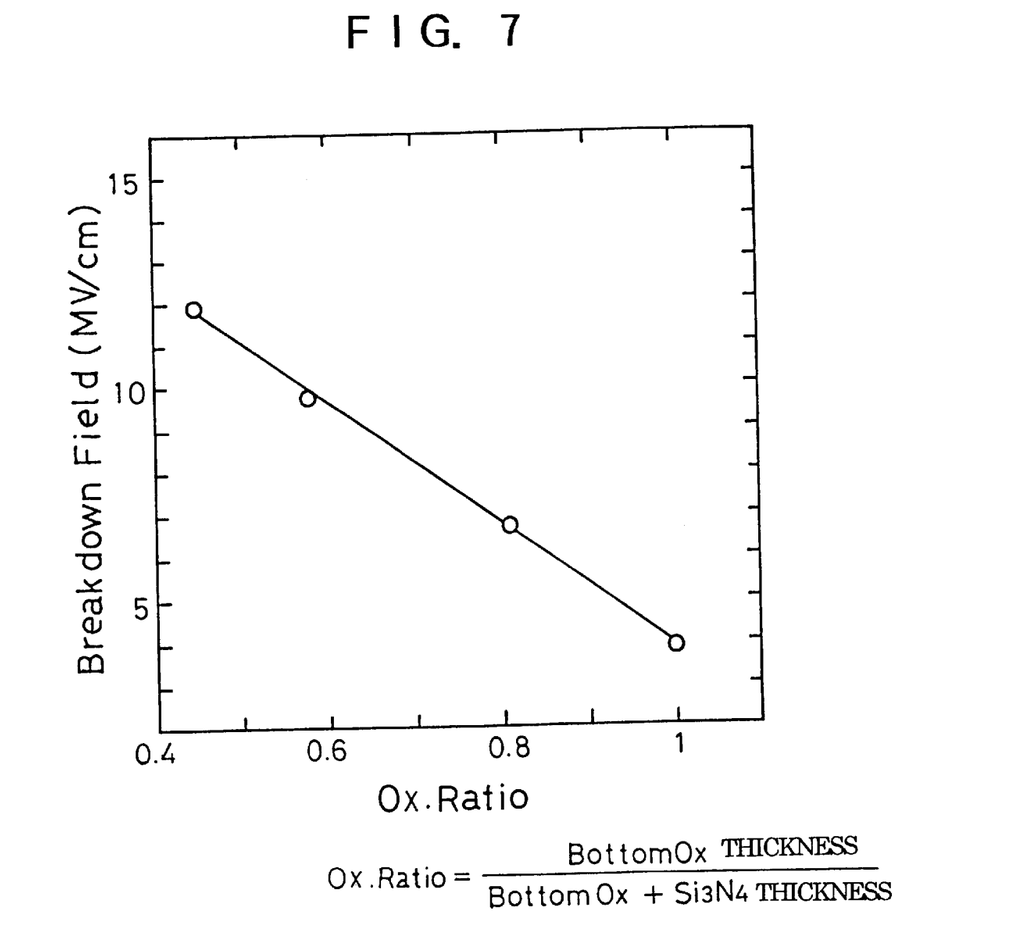
FIG. 7 is a graph showing relationship between Ox. Ratio and withstand voltage of an insulating film.
Figure 8:
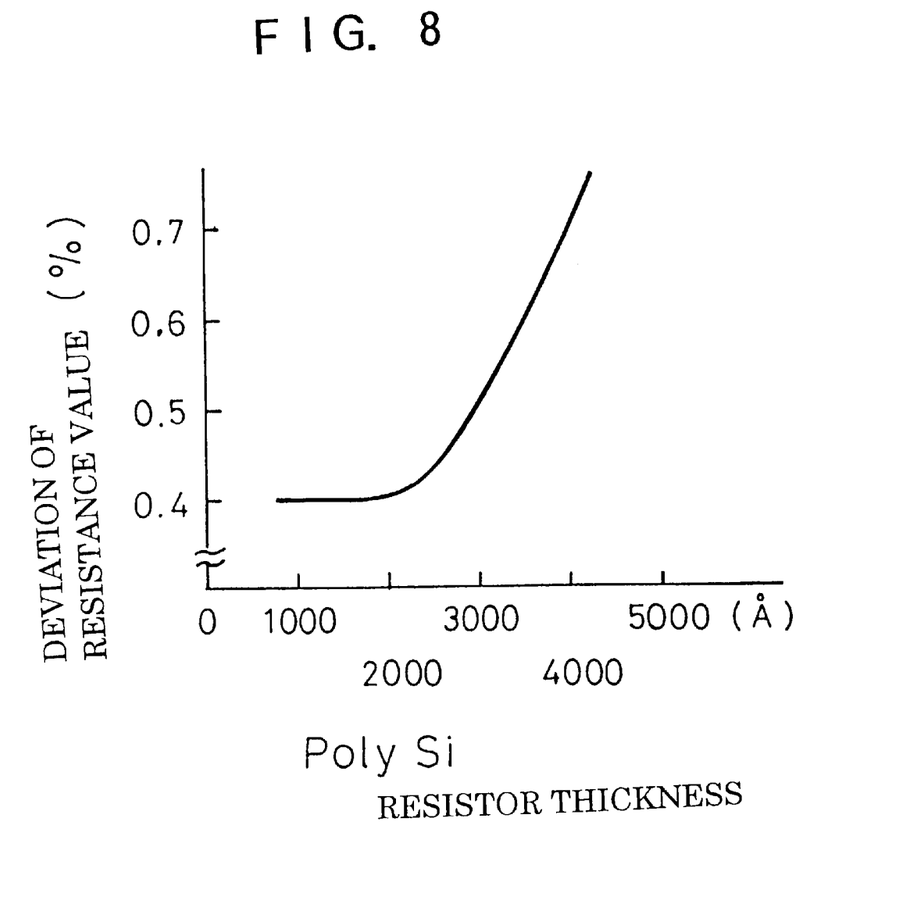
FIG. 8 is a graph showing relationship between the thick polysilicon insulating film and deviation of resistance value.

In step B shown in FIG. 6(B), polysilicon with a thickness of 3,000 Å to 4,000 Å is deposited, and heat treatment (predeposition) is carried out to implant phosphorus of high concentration into the polysilicon. Thereafter, etching is carried out so that a gate electrode 104 is formed on the gate oxide film 103 and the field oxide film 109. The sheet resistance of the gate electrode 104 was made about 30 Ω/□. Next, the oxide film on source/drain regions 102, 102 to be formed in a subsequent step by wet etching is removed, and thereafter, thermal oxidation is carried out to grow a silicon oxide film 105 (Bottom Ox.) on the entire surface of the substrate. Next, a silicon nitride film 110 is applied onto the silicon oxide film 105 by a CVD method. At this time, a space under the end of the gate electrode 104 formed by the wet etching is completely filled. Thereafter, thermal oxidation at 900° C. in an oxygen atmosphere is carried out to grow an oxide film 105 (Top Ox.). In the device according to the present invention, the oxide film of about 12 Å was formed. The thickness of the Bottom Ox. is made about 300 Å to 700 Å, and the thickness of the $Si_3N_4$ film is made about 200 Å to 1,000 Å. However, it is preferable to determine the thicknesses of the Bottom Ox. and the $Si_3N_4$ film according to a required break down field. FIG. 7 shows Ox. Ratio with respect to break down field. The axis of ordinates of the graph indicates the break down field, and the axis of abscissas indicates the Ox. Ratio (Bottom Ox. film thickness/(Bottom Ox. film thickness +$Si_3N_4$ film thickness)). In the device according to the present invention, the thickness of the Bottom Ox. was made about 600 Å, and the thickness of the $Si_3N_4$ was made about 500 Å. Next, after a polysilicon 111 is deposited, impurities (phosphorus, arsenic or $BF_2$) are implanted into the polysilicon by ion implantation to make the polysilicon have a required resistance value. The thickness of the polysilicon is thin and is about 300 Å to 2,000 Å. In the device according to the present invention, the thickness was 1,000 Å. When the film thickness is made thin, the deviation in resistance values can be lessened (FIG. 8).

Figure 6C:
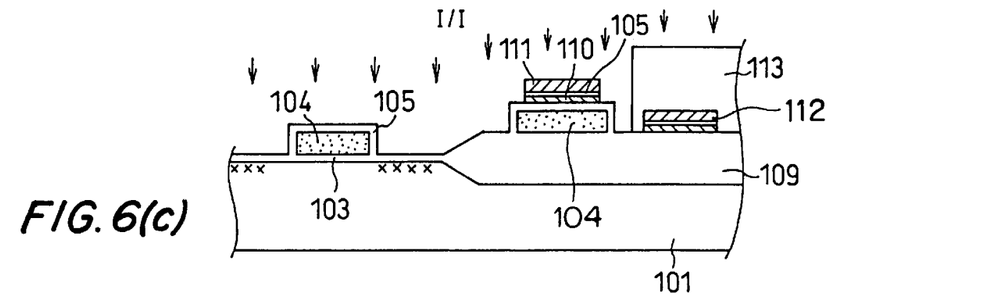

In step C shown in FIG. 6(C), a mask is patterned at an upper portion of the gate electrode 104 on the field insulating film 109 and at a resistor formation portion on the field oxide film 109. Then, the polysilicon 111, the oxide film 105 (Top Ox.) and the silicon nitride film 110 are etched at the same time. At this time, the polysilicon 111 on the gate electrode 104 is made smaller than the area of the gate electrode 104. This is because an electric field is concentrated at the place where the polysilicon 111 crosses over the gate electrode 104, so that the break down voltage is lowered. Next, the portion of the previously formed resistor 112 is covered with a photoresist 113, and impurities are implanted into the semiconductor substrate by using a high current ion implantation apparatus, and at the same time, are also implanted into the polysilicon 111 to make conductive bands. The sheet resistance of the polysilicon of the present invention was made about 130 Ω/□.

Figure 6D:
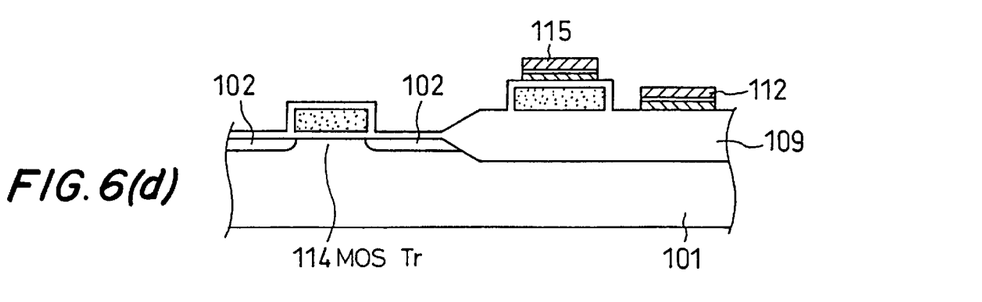

In step D shown in FIG. 6(D), the previous photoresist is removed, and high temperature heat treatment is carried out to activate and diffuse the implanted impurities so that an MOS transistor 114 is formed. In this way, the insulating film is formed at the overlap portions between the gate electrode and the source diffusion/drain diffusion formed in the semiconductor substrate, and at the same time, a capacitance element 115 and the resistor 112 can be formed by one film growth, thermal oxidation and ion implantation. The capacitance element 115 is a highly reliable device capable of withstanding a high voltage.

Figure 9:
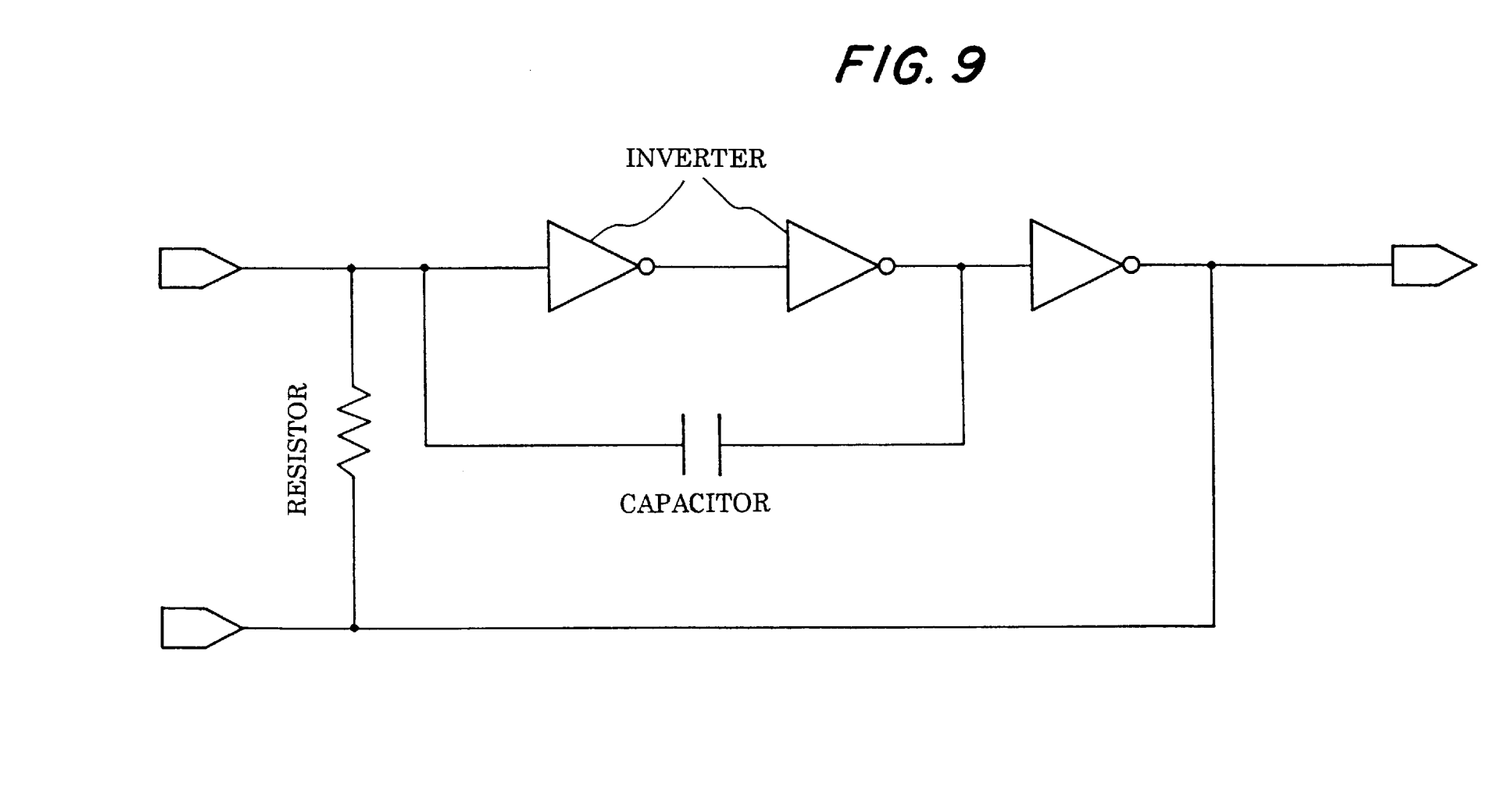
FIG. 9 is a schematic view of an oscillation circuit according to the present invention.
Figure 10A:
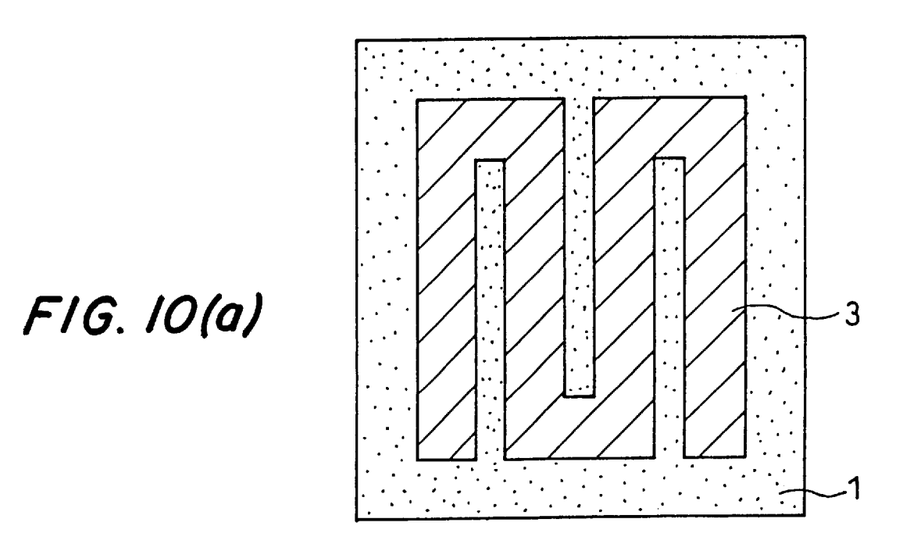
FIGS. 10a and 10b are schematic views showing a third embodiment of a semiconductor device of the present invention.
Figure 10B:
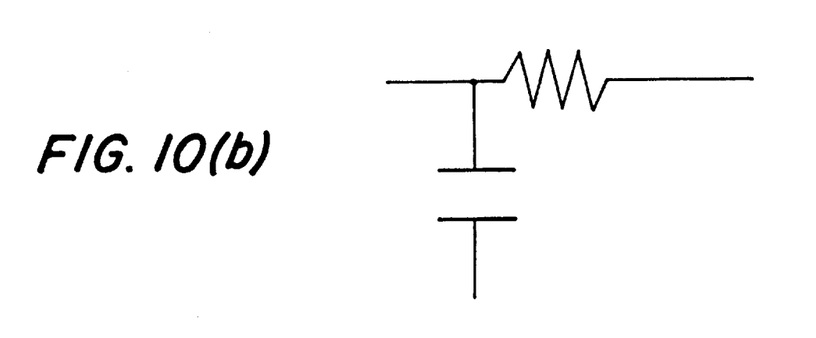

A third embodiment of a semiconductor device of the present invention will be described in detail. FIG. 9 is a view showing an oscillation circuit comprised of an inverter of P-channel and N-channel MOS transistors, and a capacitance element and a resistor element of the present invention. FIG. 10(a) is a plan view showing the structure of the capacitance and resistor, and FIG. 10(b) shows schematic symbols thereof. The capacitance element and resistor element have such structure as shown in FIG. 10(a). Thermal oxidation treatment is carried out for a first conductive band 1, for example, polysilicon having a lowered resistance due to predeposition and with a thickness of 2,500 Å to 5,000 Å, so that a silicon oxide film is grown on the polysilicon. The first conductive band may be replaced by a gate electrode of the MOS transistor. In the present invention, the thickness of the polysilicon was made about 3,000 Å and that of the silicon oxide film was made about 500 Å. Next, a silicon nitride film with a thickness of about 200 Å to 900 Å is applied onto the silicon oxide film by the CVD method. In the present invention, the thickness thereof was made about 200 Å. Thereafter, thermal oxidation at 900° C. is carried out in an oxygen atmosphere to grow an oxide film on the silicon nitride film. In the device according to the present invention, the oxide film of about 20 Å was formed. Next, a second conductive band 3, for example, polysilicon is deposited. Thereafter, in order to form diffusion layers (source/drain) of the MOS transistor, impurities (phosphorus, arsenic or $BF_2$) are implanted by ion implantation, and at the same time, impurities are also implanted into the second conductive band to lower the resistance of the second conductive band. In the present invention, for example, phosphorus at a concentration of 3 to 5 E15/cm², arsenic at a concentration of 5 to 7 E15/cm², or $BF_2$ at a concentration of 3 to 5 E15/cm² is implanted by ion implantation. A mixture of phosphorus and arsenic may be implanted. The resistor element is formed by the second conductive band, and the resistance value is adjusted by the length of the second conductive band. The resistance value becomes high as the length is prolonged. The film thickness of the polysilicon is made comparable to the polysilicon of the first conductive band 1, or made about 300 Å to 2,000 Å. In the device according to the present invention, the thickness was 2,000 Å. Finally, in order to make the polysilicon of the second conductive band have a necessary length, a photoresist is patterned and the polysilicon is etched. In this way, in the same area, the capacitance element formed of the first conductive band, the insulating layer and the second conductive band and the resistor element formed of the second conductive band can be formed without increasing steps and with a small area. FIG. 10b) shows schematic symbols of the capacitance and the resistor, and the capacitance is connected to the resistor as shown in the figure to form a part of an oscillation circuit. Further, Ox. Ratio is 0.7, and Break Down Field is 8 MV/cm as seen from FIG. 5, so that even if a voltage over 5V is applied, the device does not break down.

FIG. 11 shows a third embodiment of the present invention. In step A, a thermal oxidation film 105 is formed on a semiconductor substrate 101, and impurities with the same polarity as the substrate are ion implanted. In the present invention, phosphorus or arsenic of 1–8 E14/cm² is implanted. This ion implantation may not be carried out depending on circuits.

Figure 11A:
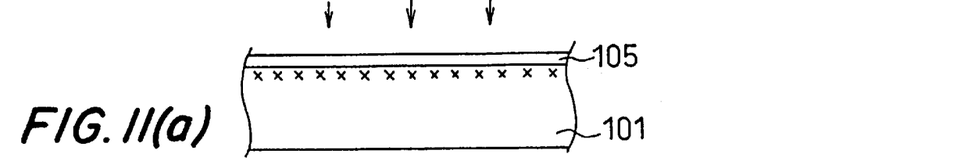
FIGS. 11a–11f are sectional views according to a step sequence showing a manufacturing method of a third embodiment of a semiconductor device of the present invention.
Figure 11B:
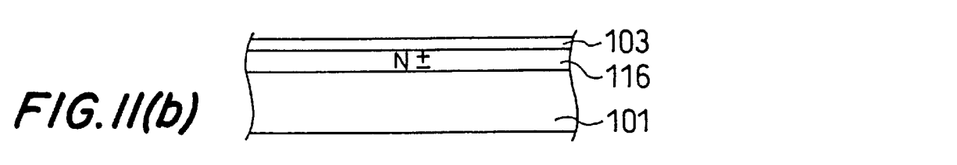

In step B, the previous thermal oxidation film 105 is removed and a gate oxide film 103 is formed. The thickness of the gate oxide film was made about 900 Å.

Figure 11C:
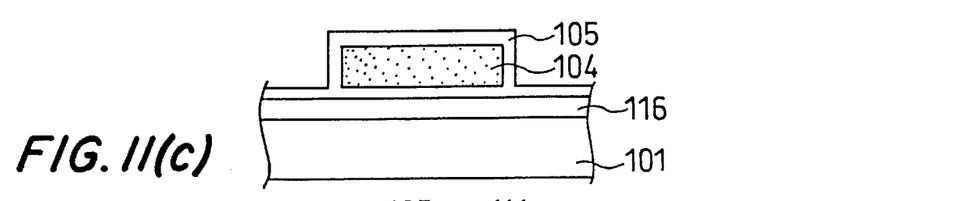

In step C, polysilicon with a film thickness of 3,000 Å to 4,000 Å is deposited, and heat treatment (predeposition) is carried out to inject phosphorus at a high concentration into the polysilicon. Thereafter, etching is carried out, and a gate electrode 104 is formed on the gate oxide film 103. The sheet resistance of the gate electrode was made about 30 Ω/□. Next, thermal oxidation treatment is carried out to grow a silicon oxide film (Bottom Ox.) on the gate electrode 104.

Figure 11D:
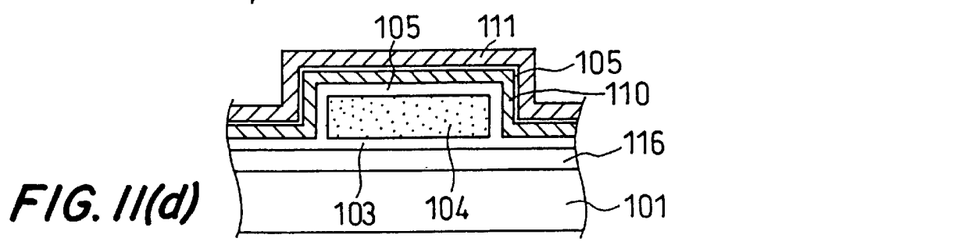

In step D, a silicon nitride film 110 is applied onto the Bottom oxide film by a CVD method. Thereafter, thermal oxidation at 900° C. in an oxygen atmosphere is carried out to grow an oxide film (Top Ox.). In the device according to the present invention, the oxide film of about 100 Å was formed. The film thickness of the Bottom Ox. is made about 300 Å to 700 Å, and the film thickness of $Si_3N_4$ is made about 200 Å to 800 Å. However, it is preferable to determine the film thickness of the Bottom Ox. and Si₃N₄ according to a required break down field. FIG. 7 shows Ox. Ratio with respect to break down field. The axis of ordinates of the graph indicates the break down field, and the axis of abscissas indicates the Ox. Ratio (=Bottom Ox. film thickness/(Bottom Ox. film thickness+Si₃N₄ film thickness)). In the device according to the present invention, the thickness of the Bottom Ox. was made about 600 Å, and that of Si₃N₄ was made about 500 Å. Next, polysilicon 111 is deposited. The film thickness of the polysilicon is thin and is about 300 Å to 2,000 Å. In the device according to the present invention, the thickness was 1,500 Å.

Figure 11E:
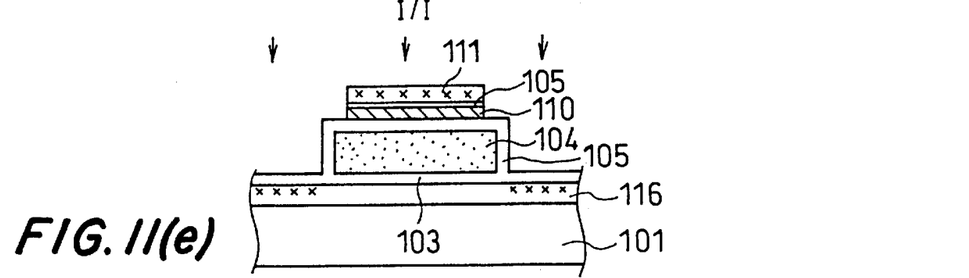

In step E, after patterning, the polysilicon, Top Ox. and silicon nitride film are etched at the same time. At this time, the polysilicon 111 on the gate electrode is made smaller than the area of the gate electrode. This is because, at the place where the polysilicon crosses over the gate electrode, an electric field is concentrated so that the break down voltage is lowered. Next, using a high current ion implantation apparatus, impurities (phosphorus, arsenic or BF₂) are implanted into the entire surface of the substrate. In the present invention, phosphorus or arsenic is implanted. The polysilicon 111 is made a conductive band by the impurity implantation.

Figure 11F:
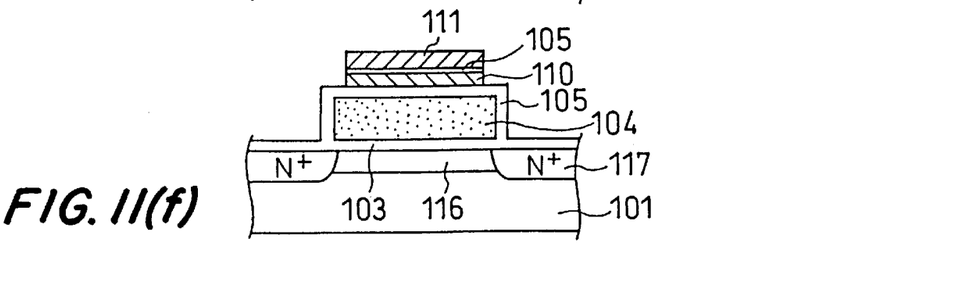

In step F, high temperature heat treatment is carried out to activate and diffuse the implanted impurities.

Figure 12:
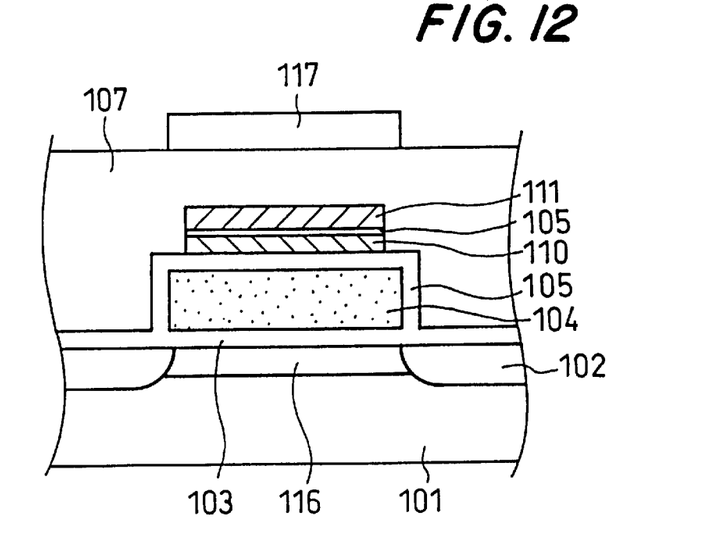
FIG. 12 is a schematic sectional view showing a fourth embodiment of a semiconductor device of the present invention.
Figure 13A:
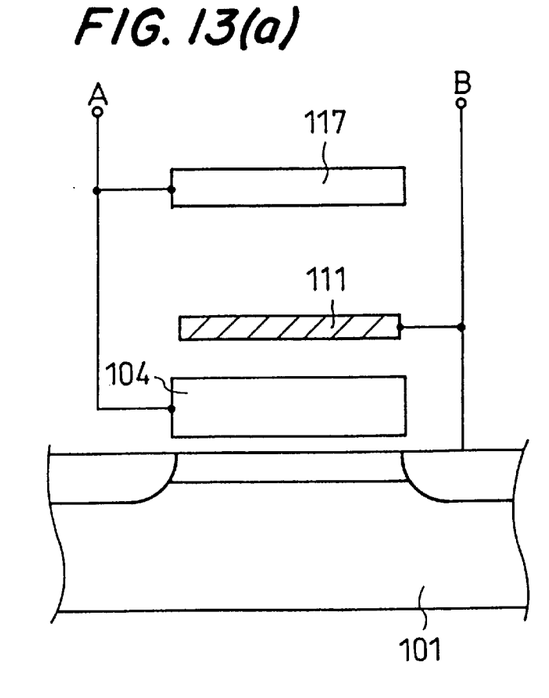
FIGS. 13a and 13b are schematic views showing the fourth embodiment of the semiconductor device of the present invention.
Figure 13B:
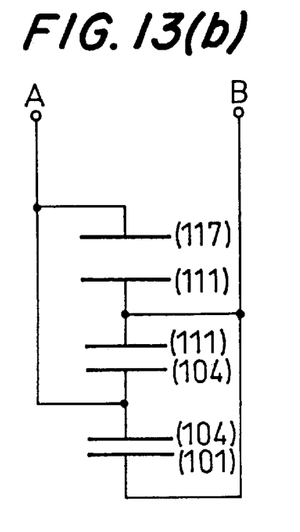

FIG. 12 is a sectional view showing a fourth embodiment of a semiconductor device according to a manufacturing method of the present invention. An intermediate insulating film 107 is grown by a CVD method or the like, and is flattened subsequently by heat treatment. Next, after a metal material is grown on the entire surface by vacuum evaporation, sputtering or the like, photolithography and etching are carried out to pattern a metal 117 on a polysilicon 111. Since this enables forming in the same area three kinds of capacitance elements, that is, a capacitance element formed of the metal 117 and the polysilicon 111, a capacitance element formed of the polysilicon 111 and the gate electrode 104, and a capacitance element formed of the gate electrode 104 and the semiconductor substrate 101, high capacitance can be made in a small area and an IC can be made small. FIG. 13(a) is a sectional view indicating FIG. 12 in a simple form, and FIG. 13(b) is a schematic view of FIG. 13(a). As shown in the drawings, when the vertically overlapping capacitance elements are connected with each other, parallel connection is obtained so that the capacitance can be made large. If there is no metal, although two kinds of capacitance elements are formed, the other two kinds of capacitance elements can sufficiently make the capacitance large, so that the IC can be made small. Of course, this capacitance is a high reliable device with a high withstand voltage.

As described above, according to the present invention, in order to prevent spaces from being formed at overlap portions between a gate electrode and source diffusion/drain diffusion, an insulator such as an oxide film or a nitride film by a CVD method is embedded and an insulating film is made into a plural kinds of insulating films, so that a highly reliable MOS semiconductor device can be formed.

What is claimed is:

1. A MOS semiconductor device comprising:
   a semiconductor substrate;
   source and drain regions formed in the semiconductor substrate in spaced-apart relationship;
   a first insulating film comprised of a single silicon oxide layer disposed on the substrate in a space overlapping opposed edges of the source and drain regions;
   a gate electrode disposed on the first insulating film; and
   a second insulating film disposed at overlapping portions between the gate electrode and the source and drain regions and comprised of a pair of silicon oxide layers and a silicon nitride layer disposed between the pair of silicon oxide layers.

2. A MOS semiconductor device according to claim 1; wherein the first insulating film has a thickness equal to or greater than 500 Å.

3. A MOS semiconductor device according to claim 1; wherein one of the silicon oxide layers of the second insulating film comprises a thermal oxidation layer, and the other of the silicon oxide layers of the second insulating film comprises a CVD grown silicon oxide layer.

4. A MOS semiconductor device according to claim 1; wherein the gate electrode is generally plate-shaped.

5. A MOS semiconductor device according to claim 4; wherein the gate electrode has a generally uniform cross-section.

6. A MOS semiconductor device comprising:
   a semiconductor substrate having a source region, a drain region, and a channel region separating the source and drain regions;
   a first insulating film disposed on the semiconductor substrate and over the channel region;
   a gate electrode disposed on the first insulating film;
   a second insulating film disposed on the semiconductor substrate and the gate electrode;
   a third insulating film disposed on the second insulating film and defining a space bounded by the first, second and third insulating films; and
   a fourth insulating film disposed in the space bounded by the first, second and third insulating films.

7. A MOS semiconductor device according to claim 6; wherein the gate electrode is generally plate-shaped.

8. A MOS semiconductor device according to claim 7; wherein the gate electrode has a generally uniform cross-section.

9. A MOS semiconductor device according to claim 6; wherein the first insulating film comprises a single silicon oxide film.

10. A MOS semiconductor device according to claim 9; wherein the single silicon oxide film has a thickness equal to or greater than 500 Å.

11. A MOS semiconductor device according to claim 6; wherein the second insulating film comprises a silicon oxide film.

12. A MOS semiconductor device according to claim 6; wherein the fourth insulating film comprises a silicon nitride film.

13. A MOS semiconductor device comprising:
   a semiconductor substrate having a source region, a drain region, and a channel region separating the source and drain regions;
   a first silicon oxide film disposed on the semiconductor substrate and over the channel region;
   a gate electrode disposed on the single silicon oxide film;
   a second silicon oxide film disposed on the semiconductor substrate;
   a third silicon oxide film disposed on the gate electrode; and
   a silicon nitride film disposed between the second and third oxide films.

14. A MOS semiconductor device according to claim 13; further comprising an insulating film disposed on the second and third silicon oxide films and defining a space bounded by the insulating film and the first, second and third silicon oxide films; and wherein the silicon nitride film is disposed in the space.

15. A MOS semiconductor device according to claim 13; wherein the first silicon oxide film has a thickness equal to or greater than 500 Å.

16. A MOS semiconductor device according to claim 13; wherein the gate electrode is generally plate-shaped.

17. A MOS semiconductor device according to claim 16; wherein the gate electrode has a generally uniform cross-section.

* * * * *